United States Patent
Brown et al.

(10) Patent No.: US 10,418,502 B2
(45) Date of Patent: *Sep. 17, 2019

(54) METHOD AND STRUCTURE FOR MULTI-CELL DEVICES WITHOUT PHYSICAL ISOLATION

(71) Applicant: MTPV Power Corporation, Austin, TX (US)

(72) Inventors: Eric Brown, Cambridge, MA (US); Andrew Walsh, Wayland, MA (US); Jose Borrego, Boston, MA (US); Paul Greiff, Wayland, MA (US)

(73) Assignee: MTPV Power Corporation, Austin, TX (US)

( * ) Notice: Subject to any disclaimer, the term of this patent is extended or adjusted under 35 U.S.C. 154(b) by 56 days.

This patent is subject to a terminal disclaimer.

(21) Appl. No.: 15/674,967

(22) Filed: Aug. 11, 2017

(65) Prior Publication Data

US 2017/0338362 A1    Nov. 23, 2017

Related U.S. Application Data

(63) Continuation of application No. 14/213,889, filed on Mar. 14, 2014, now Pat. No. 9,755,095.

(Continued)

(51) Int. Cl.
*H01L 31/042* (2014.01)
*H02N 6/00* (2006.01)
(Continued)

(52) U.S. Cl.
CPC .. *H01L 31/0475* (2014.12); *H01L 31/022441* (2013.01); *H01L 31/046* (2014.12); *H01L 31/0682* (2013.01); *Y02E 10/547* (2013.01)

(58) Field of Classification Search
CPC ............ H01L 31/0504; H01L 31/0475; H01L 31/0682; Y02E 10/50
(Continued)

(56) References Cited

U.S. PATENT DOCUMENTS 3,994,012 A   11/1976  Warner, Jr.
4,278,473 A    7/1981  Borden
(Continued)

FOREIGN PATENT DOCUMENTS

WO    WO93/12543    6/1993

OTHER PUBLICATIONS

Filip Granek, "High-Efficiency Back-Contact Back-Junction Silicon Solar Cells," Ph.D. dissertation, Albert-Ludwigs-Universitat Freiburg im Bresigau, 2009. (Year: 2009).*

*Primary Examiner* — Angelo Trivisonno
(74) *Attorney, Agent, or Firm* — Burns & Levinson, LLP; George N. Chaclas

(57) ABSTRACT

The present invention relates to multi-cell devices fabricated on a common substrate that are more desirable than single cell devices, particularly in photovoltaic applications. Multi-cell devices operate with lower currents, higher output voltages, and lower internal power losses. Prior art multi-cell devices use physical isolation to achieve electrical isolation between cells. In order to fabricate a multicell device on a common substrate, the individual cells must be electrically isolated from one another. In the prior art, isolation generally required creating a physical dielectric barrier between the cells, which adds complexity and cost to the fabrication process. The disclosed invention achieves electrical isolation without physical isolation by proper orientation of interdigitated junctions such that the diffusion fields present in the interdigitated region essentially prevent (Continued)

the formation of a significant parasitic current which would be in opposition to the output of the device.

14 Claims, 4 Drawing Sheets

Related U.S. Application Data

(60) Provisional application No. 61/793,328, filed on Mar. 15, 2013.

(51) Int. Cl.
*H01L 31/0475* (2014.01)
*H01L 31/0224* (2006.01)
*H01L 31/068* (2012.01)
*H01L 31/046* (2014.01)

(58) Field of Classification Search
USPC .................................................. 136/242, 244
See application file for complete search history.

(56) References Cited

U.S. PATENT DOCUMENTS

| | | | |
|---|---|---|---|
| 4,933,021 A * | 6/1990 | Swanson | H01L 31/03529 |
| | | | 136/249 |
| 4,933,022 A | 6/1990 | Swanson | |
| 5,164,019 A | 11/1992 | Sinton | |
| 7,388,147 B2 | 6/2008 | Mulligan et al. | |
| 2010/0051085 A1 | 3/2010 | Weidman | |

\* cited by examiner

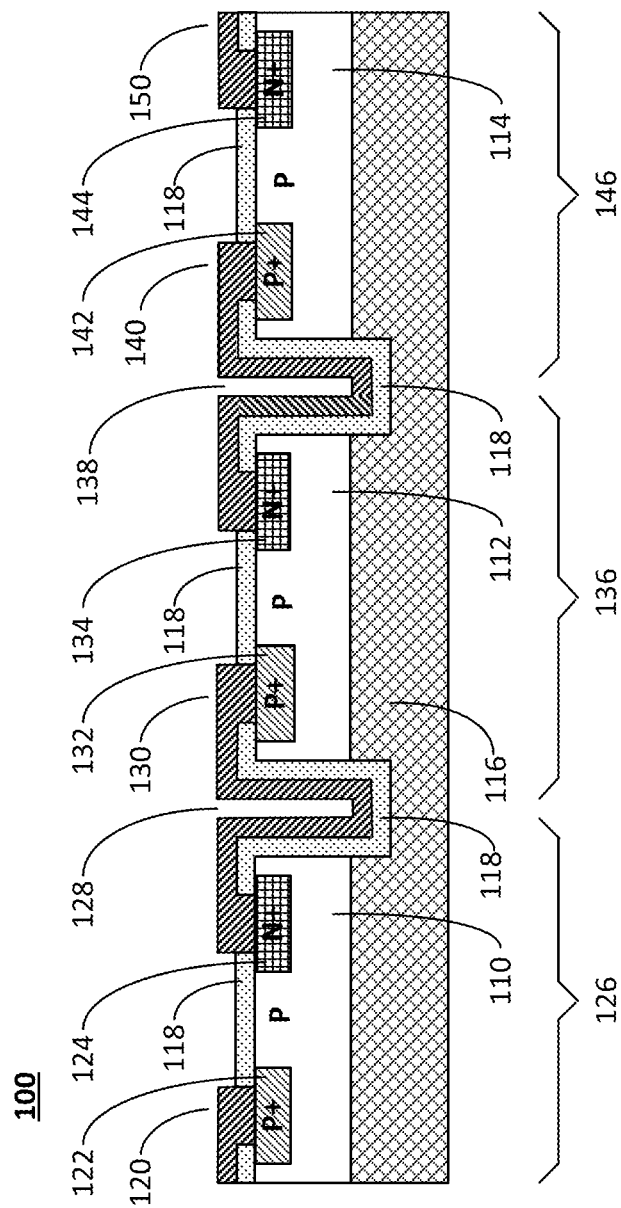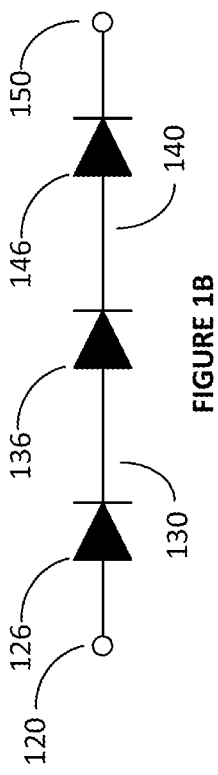
PRIOR ART
FIGURE 1A
FIGURE 1B

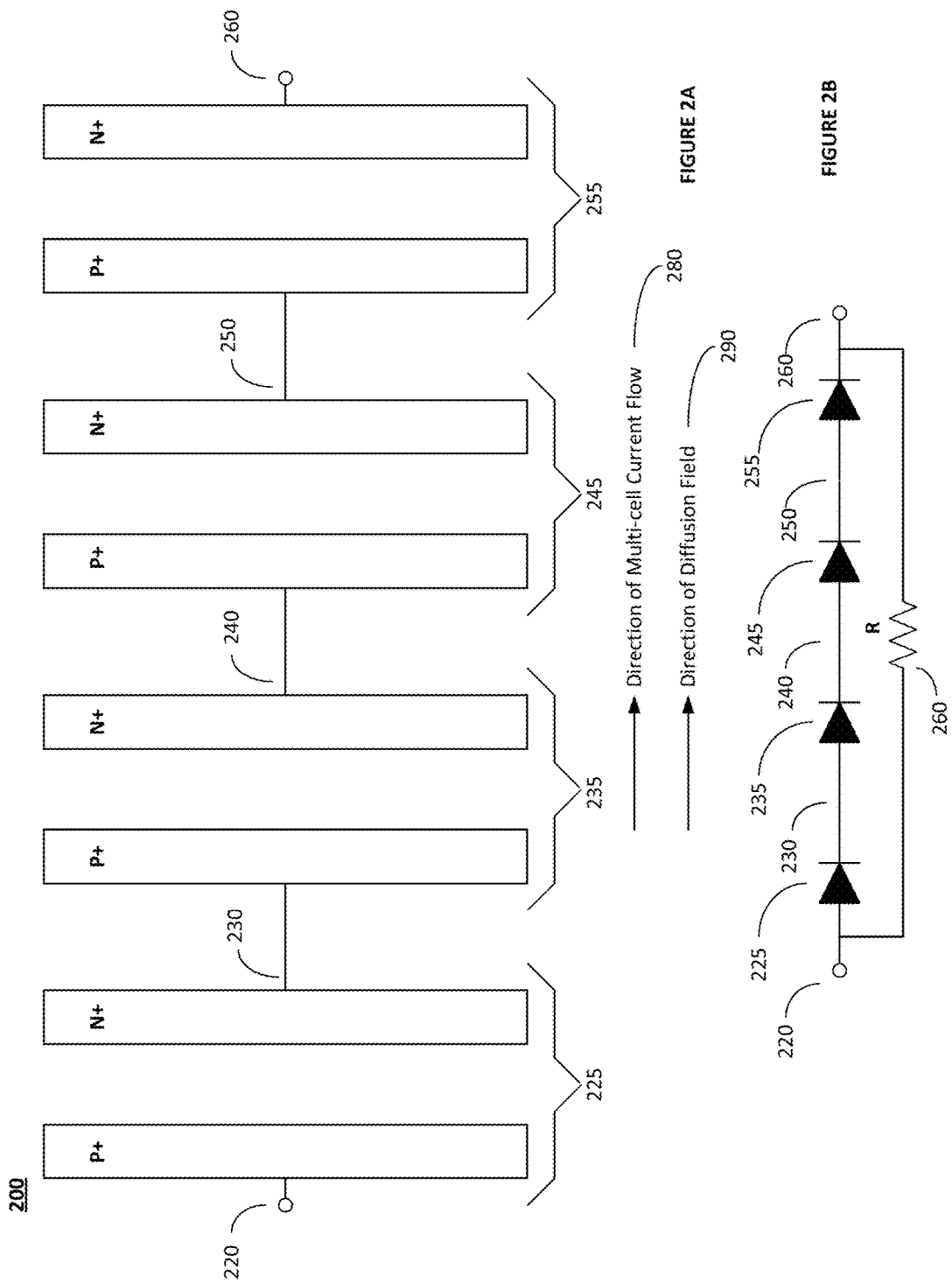

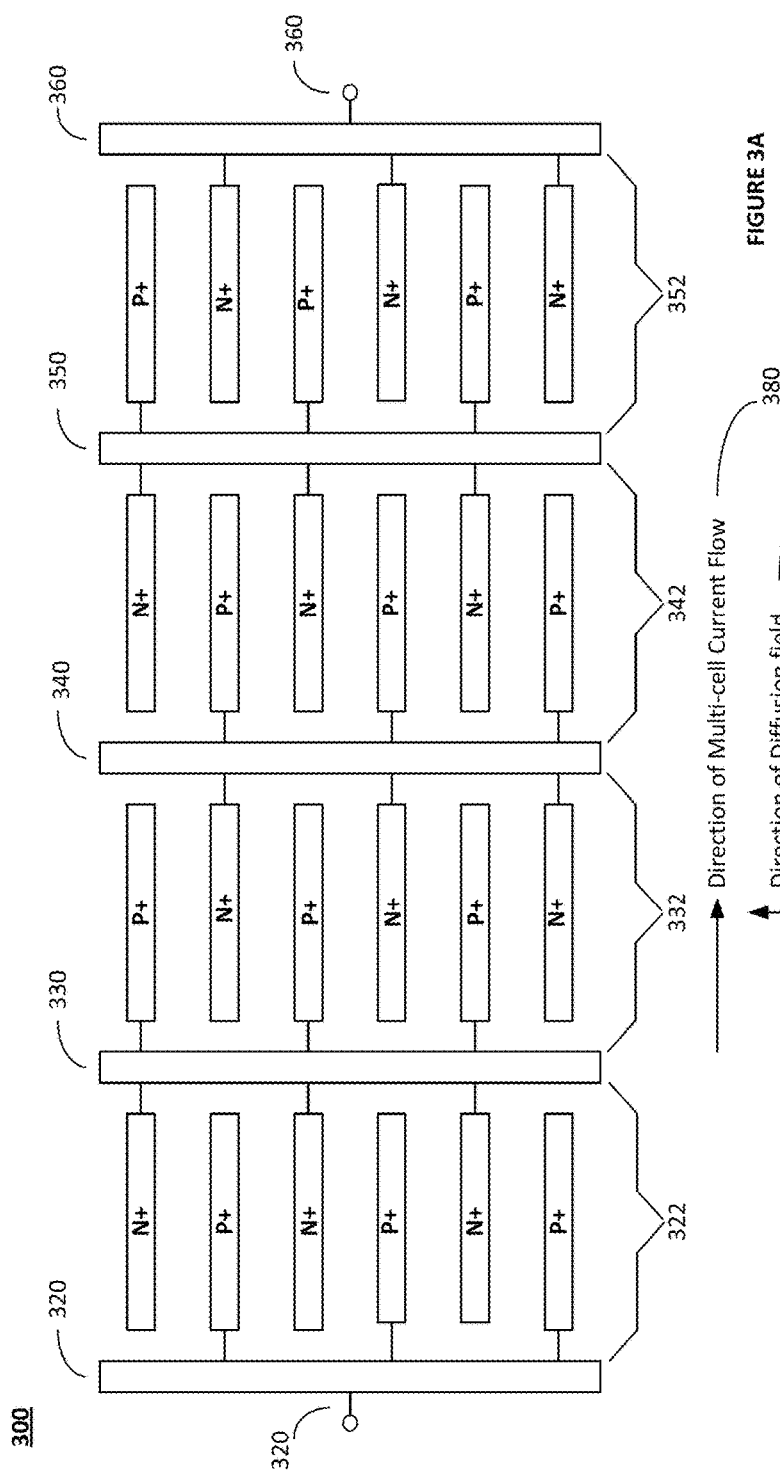
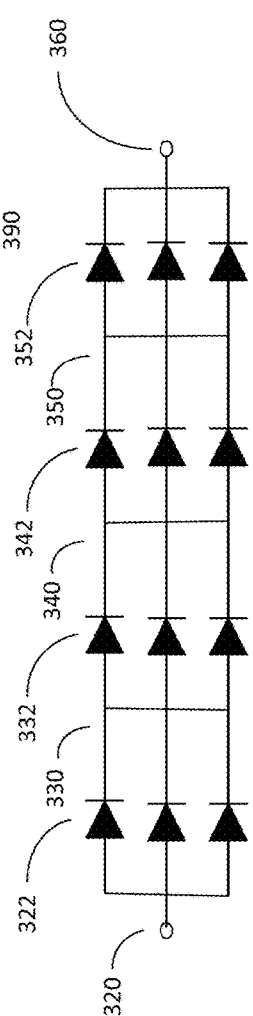
FIGURE 3A
FIGURE 3B

METHOD AND STRUCTURE FOR MULTI-CELL DEVICES WITHOUT PHYSICAL ISOLATION

CROSS-REFERENCE TO RELATED APPLICATIONS

This application is a continuation of co-pending application Ser. No. 14/213,889, entitled METHOD AND STRUCTURE FOR MULTI-CELL DEVICES WITHOUT PHYSICAL ISOLATION, filed on Mar. 14, 2014, which claims priority to U.S. Provisional Patent Application No. 61/793,328, filed Mar. 15, 2013, each of which is incorporated herein by reference in their entirety and for all purposes.

BACKGROUND

The disclosed invention relates to multicell photovoltaic semiconductor devices on a common substrate. The use of multiple monolithic cells on a common substrate where large photocurrents are generated is more desirable than the same area fabricated as a single cell or multiple interconnected single cell devices. The use of monolithic multi-cell construction reduces the output current and increases the output voltage linearly by the number of cells connected in a series string. Because of internal resistance losses are reduced in proportion to the square of the current, the overall internal power losses in multi-cell devices at high levels of illumination are greatly reduced.

In the fabrication of multi-cell devices on a common substrate, individual cells must be electrically isolated from one another. In the prior art, electrical isolation is created by the use of physical dielectric barriers between the cells, which increases fabrication cost and complexity. The invention described herein provides multiple diode strings that can be formed on a common substrate without the use of physical isolation. The disclosed invention does not require the use of a physical isolation barrier to achieve electrical isolation between cells in a multi-cell monolithic device. The invention is applicable to devices containing semiconductor materials where diodes can be fabricated with discrete P and N junctions.

In the prior art, multi-cell devices make use of physical trenches to achieve electrical isolation between cells. Most practical trench fabrication processes require the incorporation of multiple epitaxial layers into a multi-cell device. The requirement for multiple epitaxial layers further increases processing costs beyond the trench fabrication cost, and its implementation generally requires the participation of highly skilled technologists, as the multiple epitaxial layers have complex fabrication requirements.

SUMMARY OF THE INVENTION

The present invention enables a multi-cell device to be fabricated without the need for dielectric trenches to isolate individual P-N junction cells. Each individual P-N junction cell includes an absorption region and a diffusion field between the P-type and N-type material that forms as a result of the holes and electrons created by the absorption of photons and the concentration gradient that results from their collection by the P and N regions. For purposes of simplicity in this description of the invention and in the claims, the term "diffusion field" is used to summarize and include all of the carrier motions that take place as a result of their generation by photons and their motion to the collection regions by the diffusion process. The diffusion process takes place because of either a concentration gradient, as is the case for the minority carriers, or the requirement of charge neutrality, as is the case for the majority carriers. The exact mechanism in the invention which interferes with, or blocks, the parasitic current, which is a majority carrier current, is associated with the diffusion field because experimentation shows that interference or blocking of the parasitic current does not take place in cases where the electrode orientation is in the wrong direction. The holes and electrons are collected by ohmic contacts on the P-type and N-type material and result in an output photocurrent and a forward bias voltage across the P-N junction cell. The multi-cell device relies on a pattern of interdigitated P-N junction cells placed in an end-to-end configuration for efficient collection of photogenerated carriers. Electrical isolation is achieved by configuring multiple P-N junction cells in such a way that the diffusion fields created by the photocurrent flow or forward bias current flow across the P-N junction cells are transverse to the direction of total current flow between P-N junction cells, the direction of the electric field created by the voltage difference between the multi-cell ohmic contacts to the absorber regions, and the direction of parasitic current flow between the two external connections of the multi-cell device. Thus, any parasitic current and electric field in a direction between the multi-cell device output and the multi-cell device input has negligible effect on the photocurrent generated by the P-N junction cells because of the transverse relationship therebetween. This transverse relationship electrically isolates the cells.

An advantage of this implementation is a lower fabrication complexity for producing a multicell device on a common substrate. It provides the only known way of producing a multicell device without the use of epitaxial technology and trench isolation. The invention can be employed in the fabrication of multi-cell devices on a semi-insulating substrate with a thin epitaxial layer in which junction cells are disposed, allowing for absorption close to the collecting junction cells. The simple epitaxial layer is much less complex and less costly than the epitaxial layers required for the physical trench process.

In the description of the invention herein, the term diode refers to the conventional photovoltaic case wherein there is an absorption region for absorbing photons in the device having ohmic contacts on both the N-type and P-type material, and also refers to the case where there are multiple alternating N-type and P-type ohmic contacts to an absorption region within the device. The latter case is typically referred to as an interdigitated structure, wherein multiple N-type ohmic contacts are connected to a first common bus bar configuration at a first end of the interdigitated structure, and multiple P-type ohmic contacts are connected to a second common bus bar configuration at a second end of the interdigitated structure opposite the first end of the interdigitated structure. An interdigitated structure is generally employed to increase photo generated carrier collection efficiency, as the structure's design layout minimizes the distance a carrier must drift before it is collected at the ohmic contacts.

A multi-cell device that is fabricated without physical isolation between cells exhibits undesirable parasitic currents represented schematically as a resistive connection between the cells of the multi-cell device. Approximately half of the heavily doped interdigitated regions are the same polarity as the absorber and are used to form an ohmic contact with it. The other half of the heavily doped interdigitated regions are the opposite polarity of the absorber, forming the cell diode. The ohmic connections to the common substrate form potential parasitic resistive paths in the absence of physical isolation. Without the method described by the invention, this parasitic path would conduct a current in opposition to the desired output of the device.

The disclosed invention uses a pattern of interdigitated P-N junction cells placed in a configuration whereby the diffusion fields, which may be either photo generated or bias generated, serve to electrically isolate the individual junction cells, thereby creating a multi-cell device without physical isolation between individual junction cells. The P-N junction cells may be formed by diffusion, ion implantation or mesa etching. Specifically, the diffusion fields and currents between the interdigitated contact regions are directed perpendicularly to the direction of current flowing from cell to cell through the device. The isolation achieved by devices according to the present invention has been demonstrated experimentally with fabricated devices. When diffusion fields are formed perpendicular to the path of parasitic currents, the effects of the parasitic currents are minimized and electrical isolation is approximately equivalent to that provided by physical isolation. However, in an undesirable alternative configuration, the fields and currents between the interdigitated contact junction regions are oriented parallel to the direction of current flowing from cell to cell through the device and parallel to the parasitic resistive path. In this undesirable configuration, the interdigitated regions will conduct a large current opposing the desired output of the device and the device does not function as a multi-cell device.

The disclosed invention provides the only known means for achieving multi-cell function in a bulk non-epitaxial substrate, without going to the extreme of greatly thinning the substrate and forming trenches in it.

BRIEF DESCRIPTION OF THE DRAWINGS

These and other features, aspects and advantages of the present invention will become better understood with regard to the following description, appended claims, and accompanying drawings wherein:

FIG. 1A depicts a cross section view of a prior art multi-cell device employing trenches for providing physical isolation between cells;

FIG. 1B depicts an equivalent schematic representation of the multi-cell device;

FIG. 2A depicts a layout of a multicell device where an orientation of an interdigitated pattern does not provide effective cell isolation by a transverse electric field;

FIG. 2B depicts the equivalent circuit of the multi-cell device for the string shown in FIG. 2A.

FIG. 3A depicts a layout of a multicell device where an orientation of an interdigitated pattern does provide effective cell isolation by a transverse diffusion field;

FIG. 3B depicts an equivalent schematic representation of the multi-cell device and FIG. 4 depicts experimental data taken from a multi-cell device without physical isolation and having an orientation configuration of an interdigitated pattern that provides effective cell isolation by a transverse diffusion field.

DETAILED DESCRIPTION

Figure 4:
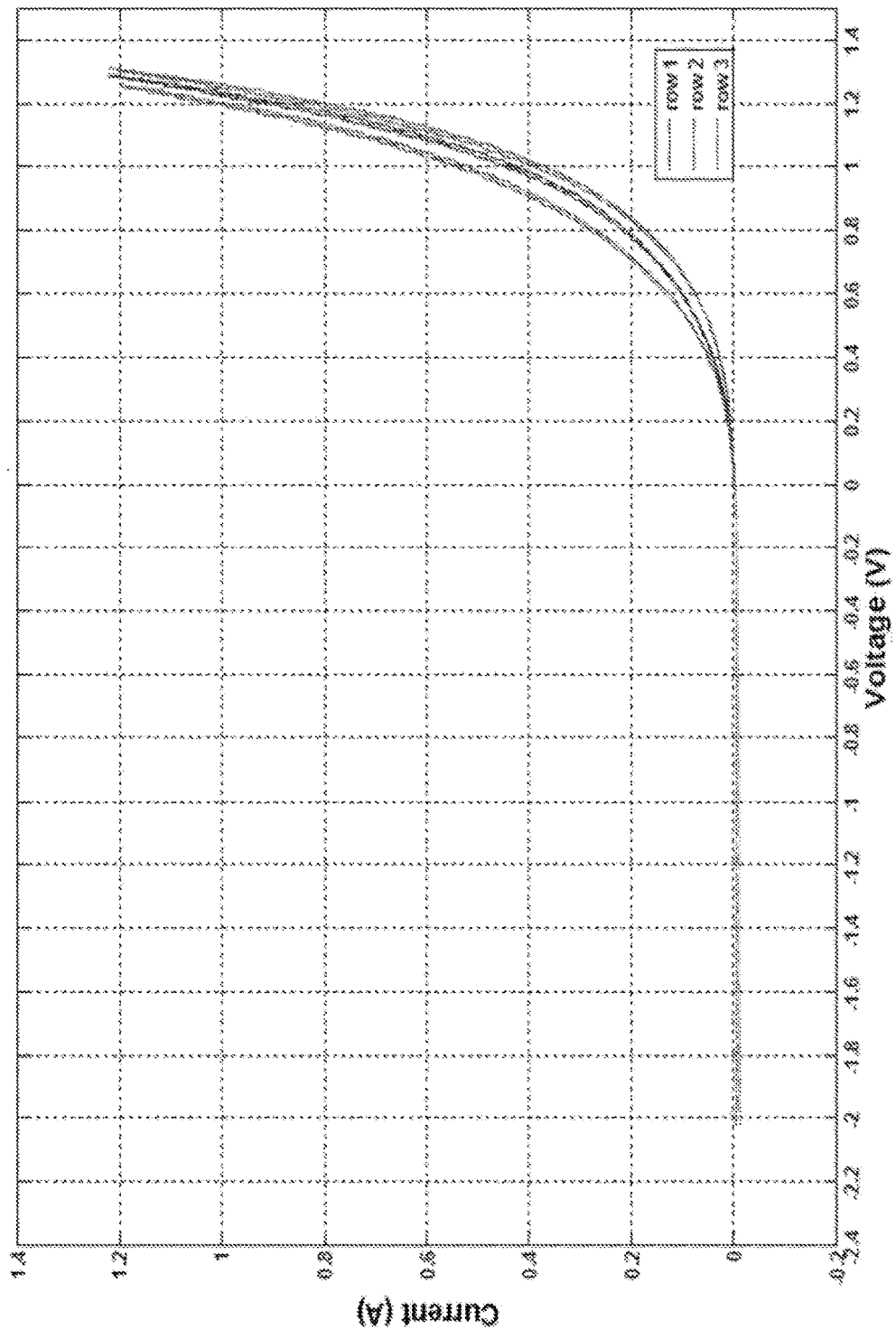

Turning to FIG. 1A, FIG. 1A depicts an epitaxial layer on a substrate of semi-insulating material. As shown in FIG. 1A, prior art multicell devices on a common substrate require the device to be electrically isolated by forming an insulator or a physical barrier between cells. The extremely high resistivity of the substrate material insulates the cell vertically. As depicted, the horizontal insulation is typically achieved by cutting trenches through an epitaxial layer into the substrate material.

FIG. 1A depicts a cross section view of a prior art multi-cell device 100 employing trenches for providing physical isolation between cells. FIG. 1B depicts an equivalent schematic representation of the multi-cell device 100. FIG. 1A depicts N+ ohmic contact regions 124, 134, 144 and P+ ohmic contact regions 122, 132, 142 formed in P-type absorption regions 110, 112, 114. These regions were originally a single epitaxial layer grown on a semi-insulating substrate starting wafer 116. The use of this type of substrate, which is a material of high resistivity, provides vertical isolation for the cells. As shown, the single epitaxial layer has been divided into cells 126, 136, 146 by the trench configuration 128, 138. The trenches are lined with silicon dioxide 118 to provide horizontal isolation and top surface isolation. Metallization layers 120, 130, 140, 150 provide external and internal connections for the device 100. Only the serial string connections are shown. There is well-known multi-cell methodology in the prior art that utilizes both trenches 128, 138 and multiple epitaxial layers that is even more complex than the configuration shown in FIG. 1A. This methodology employs what is commonly known as a lateral collection layer. In contrast to the cross section of the prior art, the invention may use a single epitaxial layer, but does not have the complexities involved in trench or multi-layer epitaxial fabrication.

Turning to FIG. 2A, FIG. 2A depicts a junction layout of a multi-cell device 200 where an interdigitated pattern does not provide effective electrical or physical isolation. The path of current in the diffusion fields 290 of the cells 225, 235, 245, 255 and total current flow 280 is parallel and generally in the same direction as the parasitic current path and the output current 280 flowing through the device 200. The cells are connected edge to edge internally by metallization 230, 240, 250 and externally by metallization 220, 260. The equivalent circuit for the string shown in FIG. 2A is shown in FIG. 2B. The current in the parasitic feedback resistor 260 is not opposed, which degrades the output of the device. This configuration 200 does not provide isolating fields and is an example of an ineffective configuration. This is a very ineffective isolation method and gives poor results. For simplicity, only one pair of junctions is shown for each cell. However, cells may comprise multiple interdigitated junctions connected by buss bars.

Turning to FIG. 3A, FIG. 3A depicts a top view of a multi-cell device 300 that provides effective electrical isolation according to the disclosed invention by selective placement and orientation of the P-N interdigitated junctions. FIG. 3A depicts four cells 322, 332, 342, 352 connected in a series configuration. The cells 322, 332, 342, 352 each have interdigitated junctions connected in parallel. These cells or sub-cells are connected by bus bars 330, 340, 350 to build up output voltage and minimize internal losses. The cells have external connections 320, 360. FIG. 3B depicts an equivalent schematic representation of the multi-cell device 300. As depicted in FIG. 3A, the diffusion field current flow 390 is perpendicular to the total current flow 380, to an electric field present in the substrate, and the direction of the parasitic path. This perpendicular orientation of the diffusion field and diffusion current 390 is in opposition to the electric field in the substrate and results in electrical isolation approximately equal to that provided by physical isolation without the use of physical isolation, such as trenches.

Turning to FIG. 4, FIG. 4 shows the forward and reverse characteristics of a string of five diodes fabricated on a common bulk substrate with no physical isolation according to the disclosed invention. The three curves are generated from three separate diode strings. The voltage achieved is consistent with the expected forward voltage of germanium material. A single germanium diode would have a voltage of approximately 200 mV in forward bias, so the experimentally demonstrated accumulated voltage of approximately one volt from the string of diodes, as shown in FIG. 4, is what would be expected from a string of five electrically isolated diodes biased in the forward direction. If electrical isolation had not been achieved, the tested string (on a common substrate) output would look like a single forward biased diode with an internal resistor in series, resulting in a lower voltage output.

The illustration of the invention, as provided herein, is based primarily on the operation of a photovoltaic device, however, the invention is not restricted to photovoltaic devices and applies equally well to a forward biased string of diodes used for any purpose.

The effectiveness of the configuration employed, as in FIG. 3 according to the disclosed invention, and the ineffectiveness of the configuration employed in FIG. 2, have been verified by experimentation. Based on an experimental sample, there is no significant difference in performance between physical isolation by the prior art and the field enabled electrical isolation provided by the disclosed invention. In general, the electrical isolation, according to the invention, is improved by providing an interdigitated diode configuration in which the separation distance between the P+ region of the cell and the N+ region of the cell is small relative to the length of the junctions. A small separation distance between the P+ region of the cell and the N+ region of the cell is preferred, so that a high diffusion field is obtained. In a preferred embodiment, the separation distance is nominally 5 to 50 micrometers, and the length of the cell is at least ten times the separation distance. In general terms, these dimensions and this ratio of dimensions provide a high blocking field and a weak parasitic field.

In the course of trying to improve the output current of a multi-cell device on a bulk substrate without physical isolation, a number of cell layouts were experimentally tested. Superior results were obtained for the layout as depicted in FIGS. 3A and 3B where the device geometry provides multi-cell functionality without physical isolation between cells. In a preferred embodiment of the invention, the individual cells are formed by an interdigitated construction of junctions with like junctions connected by bus bars. The bus bar connection between cells alternates P to N in a fashion to form a diode string which has a beginning-to-end dimension. The individual junctions within a cell have a long dimension that is parallel to the direction of the beginning-to-end dimension of the diode string. The junctions may be formed by diffusion, ion implant, Schottky barrier, or other known processes. The preferred embodiment of the invention is alternatively described as a multiple cell device on a common substrate wherein the junctions and ohmic contact regions of each cell are in the form of long interdigitated fingers, and the long direction of these fingers is parallel to the long direction of the parasitic path formed by ohmic contacts of some of the fingers to the common substrate, and the long direction of these finger is parallel to the beginning-to-end path of the diode string.

The invention claimed is:

1. A multi-cell device comprising:
   a monolithic substrate;
   ohmic contacts on the substrate for external connection so that a multi-cell current flows between the ohmic contacts;
   a plurality of cells fabricated adjacently on the substrate, each cell of the plurality of cells includes a P-N junction creating a diffusion field between P-type material and N-type material, wherein the P-type material and the N-type material are interdigitated; and
   a bus structure on the substrate to carry the multi-cell current flow, the bus structure extending from a first side of one of the plurality of cells to an adjacent side of another of the plurality of cells,
   wherein the P-N junction of each cell is oriented such that the diffusion field within each P-N junction is in a perpendicular orientation to the multi-cell current flow.

2. The device of claim 1 wherein the P-type material and the N-type material are rectangular and a spacing between a P+ region and a N+ region of the P-N junction of each of the plurality of cells is less than a length of each of the plurality of cells and formed so that the diffusion field is strong enough to impact majority carriers.

3. The device of claim 1 wherein the P-N junctions of the plurality of cells are connected in parallel.

4. The device of claim 1 wherein a spacing between a P+ region and a N+ region of the P-N junction of each of the plurality of cells is less than a width of each of the plurality of cells.

5. The device of claim 1 wherein a length of each P-N junction of the cells is greater than 10 times a spacing between a P+ region and a N+ region of the respective cell.

6. The device of claim 1 where the substrate is selected from the group consisting of a homogeneous bulk semiconductor material, a substrate with an epitaxial layer, and a semi-insulating material with a thin epitaxial layer.

7. The device of claim 1 wherein the multi-cell device is a photovoltaic device.

8. A multi-cell device comprising:
   ohmic contacts for two external connections on the multi-cell device having an electrical potential, an electric field in a substrate, and a current flow between the two external connections; and
   a plurality of cells fabricated on the substrate, the cells being spaced apart from one another and interconnected by a respective bus extending between sides of adjacent cells, each cell of the plurality of cells having a diffusion field resulting from a presence of photo-generated or bias generated carriers,
   wherein the diffusion field is perpendicular to a multi-cell current flow, a parasitic current flow and the electric field in the substrate between the two external connections, and
   wherein: a spacing between a P+ region and a N+ region of each of the plurality of cells is less than a length of the respective cell and formed so that the diffusion field is strong enough to prevent majority carrier generation; a region of the substrate directly between each of two adjacent cells and beneath the bus consists of material that is a same composition as material of substrate regions having the plurality of cells disposed thereon; and the region of the substrate directly between each of two adjacent cells and beneath the bus does not have physical isolation.

9. The device of claim 8 wherein a spacing between the P+ region and the N+ region of each of the plurality of cells is less than a width of the respective cell.

10. The device of claim 8 wherein a length of each cell of the plurality of cells is greater than 10 times a spacing between the P+ region and the N+ region of the cell.

11. A semiconductor device comprising:
a substrate;
a first bus bar on the substrate, the first bus bar extending along a first axis;
a first cell on the substrate directly connected to a first side of the first bus bar; and
a second cell on the substrate directly connected to a second side of the first bus bar so that the first bus bar extends from the first cell to the second cell,
wherein each cell has a plurality of elongated continuous P-type regions interdigitated with a plurality of elongated continuous N-type regions along a second axis that is perpendicular to the first axis, the P-type and N-type regions having a small separation distance to form a plurality of P-N junctions that generate a high diffusion field along the second axis to prevent majority carrier generation, and
wherein the region of the substrate directly between the first and second cells and beneath the first bus bar does not have a physical isolation structure.

12. The semiconductor device of claim 11, further comprising: a second bus bar connected to the first cell and a third bus bar connected to the second cell and wherein a region of the substrate directly between the cells and beneath the bus bars consists of material that is a same composition as material of substrate regions having the first and second cells disposed thereon.

13. The semiconductor device of claim 12, further comprising a third cell on the substrate connected to the third bus bar, wherein the third cell has a plurality of P-type regions interdigitated with a plurality of N-type regions to form a plurality of P-N junctions.

14. The semiconductor device of claim 12, further comprising a first ohmic contact connected to the second bus bar and a second ohmic contact connected to the third bus bar for providing external connection with a current flow between the first and second ohmic contacts.

* * * * *